United States Patent
Koo et al.

(10) Patent No.: US 9,618,982 B2
(45) Date of Patent: Apr. 11, 2017

(54) TOUCH WINDOW AND TOUCH DEVICE INCLUDING THE SAME

(71) Applicant: LG INNOTEK CO., LTD., Seoul (KR)

(72) Inventors: Chan Kyu Koo, Seoul (KR); Jung Hwan Bang, Seoul (KR); Jong Sun Kim, Seoul (KR); Tae Kyung Kim, Seoul (KR); Hyun Soo Kim, Seoul (KR); Jun Sik Shin, Seoul (KR); Joon Hyuk Yang, Seoul (KR); Ji Hyouk Chung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 149 days.

(21) Appl. No.: 14/446,001

(22) Filed: Jul. 29, 2014

(65) Prior Publication Data
US 2015/0028897 A1    Jan. 29, 2015

(30) Foreign Application Priority Data

Jul. 29, 2013  (KR) .................. 10-2013-0089660
Jul. 29, 2013  (KR) .................. 10-2013-0089662

(51) Int. Cl.
   *G06F 1/16*   (2006.01)
   *G01R 27/26*  (2006.01)
   (Continued)

(52) U.S. Cl.
   CPC ....... *G06F 1/1692* (2013.01); *G01R 27/2605* (2013.01); *G06F 3/044* (2013.01);
   (Continued)

(58) Field of Classification Search
   CPC .......... G06F 1/16; G06F 1/1692; G06F 3/044; G06F 3/0416; G06F 2203/04112;
   (Continued)

(56) References Cited

U.S. PATENT DOCUMENTS

2009/0101417 A1 *  4/2009  Suzuki ................. G06F 3/0418
                                                178/18.06
2010/0060602 A1    3/2010  Agari et al.
(Continued)

FOREIGN PATENT DOCUMENTS

JP    2012-236276 A    12/2012
JP    2013-093014 A     5/2013
(Continued)

OTHER PUBLICATIONS

European Search Report in European Application No. 141786863, dated Nov. 5, 2014.

*Primary Examiner* — Son Le
*Assistant Examiner* — Zannatul Ferdous
(74) *Attorney, Agent, or Firm* — Saliwanchik, Lloyd & Eisenschenk

(57) ABSTRACT

Disclosed is a touch window. The touch window includes a substrate; a sensing electrode disposed on the substrate to sense a position; wire parts to electrically connect the sensing electrode; and a dummy pattern between the wire parts, wherein the wire parts include first extending parts and second extending parts having mutually different directionalities.

17 Claims, 11 Drawing Sheets

(51) Int. Cl.
 *G06F 3/041* (2006.01)
 *G06F 3/044* (2006.01)
(52) U.S. Cl.
 CPC .. *G06F 3/0416* (2013.01); *G06F 2203/04103* (2013.01); *G06F 2203/04112* (2013.01)
(58) Field of Classification Search
 CPC .......... G06F 2203/04103; G01R 27/26; G01R 27/2605; H05K 1/03
 USPC ........................................................ 324/690
 See application file for complete search history.

(56) References Cited

U.S. PATENT DOCUMENTS

| | | |
|---|---|---|
| 2012/0019457 A1 | 1/2012 | Cho et al. |
| 2012/0299638 A1* | 11/2012 | Han .................... G06F 3/044 327/517 |
| 2013/0140061 A1 | 6/2013 | Lim et al. |
| 2013/0169548 A1 | 7/2013 | Kim et al. |
| 2014/0071358 A1 | 3/2014 | Kuriki |
| 2014/0218325 A1 | 8/2014 | Iwami |

FOREIGN PATENT DOCUMENTS

| | | |
|---|---|---|
| KR | 10-2010-0058046 A | 6/2010 |
| KR | 10-2012-0131874 A | 12/2012 |
| KR | 10-2013-0005353 A | 1/2013 |
| KR | 10-2013-0015304 A | 2/2013 |

* cited by examiner

TOUCH WINDOW AND TOUCH DEVICE INCLUDING THE SAME

CROSS-REFERENCES TO RELATED APPLICATIONS

This application claims the benefit under 35 U.S.C. §119 of Korean Patent Application Nos. 10-2013-0089660 and 10-2013-0089662, filed Jul. 29, 2013, which are hereby incorporated by reference in their entirety.

BACKGROUND

Technical Field

The disclosure relates to a touch window and a touch device including the same.

Recently, a touch panel, which performs an input function through the touch of an image displayed on a touch device by an input device, such as a stylus pen or a hand, has been applied to various electronic appliances.

The touch panel may be typically classified into a resistive touch panel and a capacitive touch panel. In the resistive touch panel, the position of the touch point is detected by detecting the variation of resistance according to the connection between electrodes when pressure is applied to an input device. In the capacitive touch panel, the position of the touch point is detected by detecting the variation in capacitance when a finger of the user is touched on the capacitive touch panel between electrodes. When taking into consideration the convenience of a fabrication scheme and a sensing power, the capacitive touch panel has been spotlighted in a smaller model touch panel recently.

In the touch panel, wires for wiring electrodes to an external circuit are provided at least at left, right and lower ends of the touch panel. Such wires may be patterned through a photoresist process. However, there is a limit to form a wire pattern through a previous etching scheme. That is, it is impossible to form a fine pattern since there is a limit to reduce a line width of a wire. For this reason, an available area may be reduced.

In addition, there may be a limit to a design due to a bezel for hiding the wires.

Meanwhile, when the wire pattern is etched, an electrode material is not perfectly etched at any other portions except for the wires to still be residual, so that an electrical short circuit may occur.

BRIEF SUMMARY

The embodiment provides a touch window having improved reliability.

According to the embodiment, there is provided a touch window including: a substrate; a sensing electrode disposed on the substrate to sense a position; wire parts to electrically connect the sensing electrode; and a dummy pattern between the wire parts, wherein the wire parts include first extending parts and second extending parts having mutually different directionalities.

The touch window according to the embodiment includes the wire part which includes the first extending part and the second extending part bent from the first extending part. Since the first and second extending parts are formed in mutually different directions, metallic materials that remain without being etched may not exist at any other portions except for the wire part. That is, the portions except for the main pattern corresponding to the first and second extending parts can be prevented from being non-etched. Therefore, the wire part can be prevented from being electrically short circuited with each other and the electric property can be improved.

In addition, according to the embodiment, a line width of the wire part is formed in a very thin fine pattern, so that the area of an unavailable area in which the wire part is disposed can be reduced. Thus, a narrow bezel of the touch window may be achieved. Therefore, a screen size can be ensured and variety in design can be provided without any limitations to a bezel.

DETAILED DESCRIPTION

Figure 1:
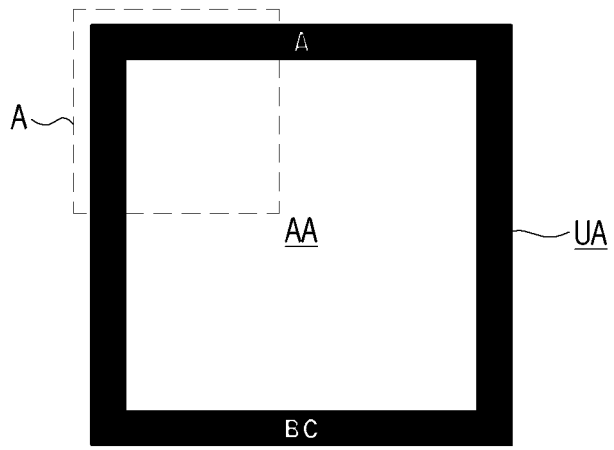
FIG. 1 is a schematic plan view showing a touch window according to an embodiment.

In the following description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer (or film), a region, a pattern or a structure shown in the drawings may be exaggerated, omitted or schematically drawn for the purpose of convenience or clarity. In addition, the size of elements does not utterly reflect an actual size.

Hereinafter, the embodiment will be described with reference to accompanying drawings.

Figure 2:
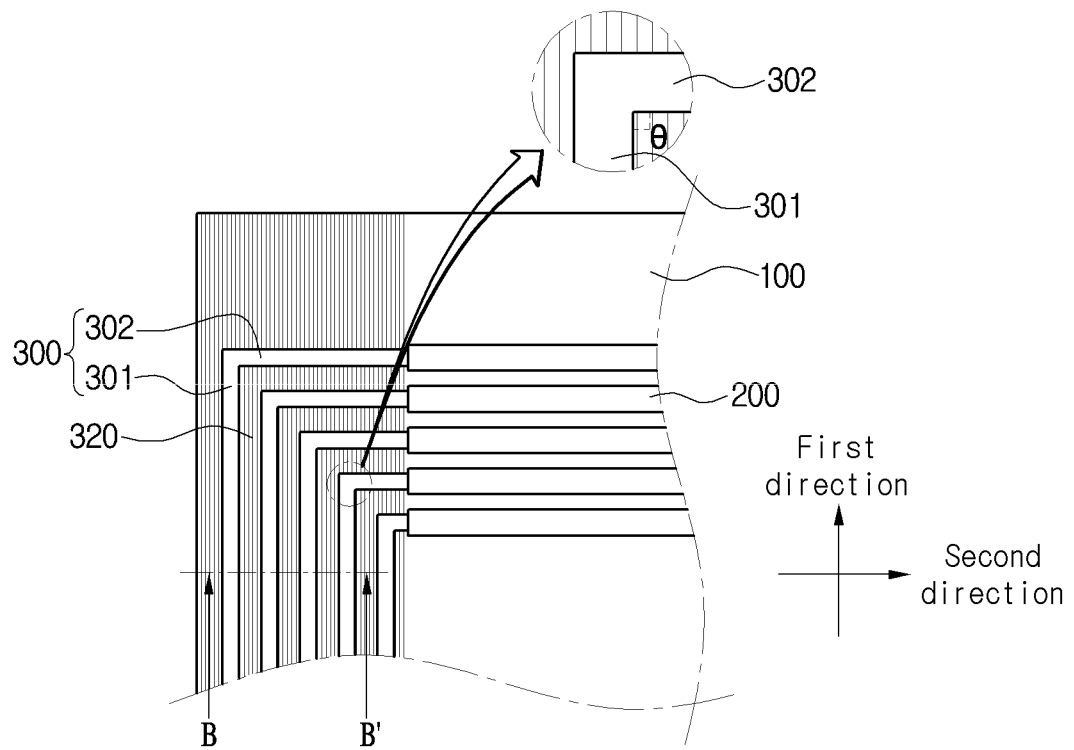
FIG. 2 is an enlarged view showing portion 'A' of FIG. 1.

First, with reference to FIGS. 1 to 3, a touch window according to the first embodiment will be described in detail. FIG. 1 is a schematic plan view showing a touch window according to an embodiment. FIG. 2 is an enlarged view of portion A of FIG. 1. FIG. 2 is a sectional view taken along line B-B' of FIG. 2.

Referring to FIGS. 1 and 2, a touch window 10 according to the embodiment includes a substrate 100 having an active area AA, in which a position of an input device (e.g., finger) is detected, and an inactive area UA provided at a peripheral portion of the active area AA.

In this case, sensing electrodes 200 may be formed in the active area AA such that the input device may be sensed. A wire part 300 electrically connecting the sensing electrodes 200 may be formed in the inactive area UA. In addition, an external circuit connected to the wire part 300 may be placed in the inactive area UA.

If the input device such as the finger touches the touch window, the variation of capacitance occurs in the touched part by the input device, and the touched portion subject to the variation of the capacitance may be detected as a touch point.

Hereinafter, the touch window will be described in more detail.

The substrate 100 may include various materials to support the sensing electrode 200, a wire part 300, and a circuit substrate formed on the substrate 100. For instance, the substrate 100 may include a glass substrate or a plastic substrate.

An outer dummy layer is formed in the inactive area UA of the substrate 100. The outer dummy layer may be coated with a material having a predetermined color so that the wire part 300 and a printed circuit board connecting the wire part 300 to external circuits cannot be viewed from the outside. The outer dummy layer may have a color suitable for a desired outer appearance thereof. For example, the outer dummy layer includes black pigments to represent black. In addition, a desired logo may be formed in the outer dummy layer through various schemes. The outer dummy layer may be formed through deposition, print, and wet coating schemes.

The sensing electrode 200 may be formed on the substrate 100. The sensing electrode 200 may detect whether the input device such as the finger is touched or not. FIG. 2 shows the sensing electrode 200 extending in a second direction on the substrate 100, but the embodiment is not limited thereto. Accordingly, the sensing electrode 200 may extend in a first direction crossing the second direction. In addition, the sensing electrode 200 may two types of sensing electrodes having shapes extending in the first and second directions.

FIG. 2 shows the sensing electrode 200 having a bar shape, but the embodiment is not limited thereto. Therefore, the sensing electrode 200 may be formed in various shapes.

The sensing electrode 200 may include a transparent conductive material such that electricity may flow therethrough without obstructing the transmission of light. To the end, the sensing electrode 200 may include various materials such as indium tin oxide, indium zinc oxide, copper oxide, carbon nano tube (CNT), conductive polymer or an interconnecting structure. The interconnecting structure may be a micro-structure having a diameter of 10 nm to 200 nm. In this case, the sensing electrode 200 may include a nanowire.

The sensing electrode 200 may include a metallic material having superior electric conductivity. For example, the sensing electrode 200 may include at least one selected from the group consisting of Cu, Au, Ag, Al, Ti, Ni and the alloy thereof. Thus, the electric characteristic of the touch window to which the sensing electrode 200 is applied may be improved.

In addition, the sensing electrode 200 may include a conductive pattern. That is, the sensing electrode 200 may include a mesh shape. In this case, the sensing electrode may include various metals representing superior electric conductivity.

Meanwhile, FIG. 2 shows the sensing electrode 200 extending in one direction, but the embodiment is not limited thereto. For instance, the sensing electrode 200 may include two types of sensing electrodes consisting of one sensing electrode extending in one direction and the other sensing electrode extending in the other direction crossing the one direction.

The one sensing electrode pattern and the other sensing electrode pattern may be variously formed according to the structure of a touch panel.

For example, one sensing electrode pattern and the other sensing electrode pattern may be together formed on one surface of a cover substrate.

In addition, the one sensing electrode pattern may be formed on one surface of the cover substrate and the other sensing electrode pattern may be formed on one surface of an electrode substrate disposed on the cover substrate.

In addition, the one sensing electrode pattern may be formed on one surface of a first electrode substrate disposed on the cover substrate and the other sensing electrode pattern may be formed on a second electrode substrate disposed on the first electrode substrate.

In addition, the one sensing electrode pattern may be formed on one surface of a glass or film and the other sensing electrode pattern may be formed on the other surface of the glass or film.

The touch panel according to the embodiment may have various structures according to the positions of the one sensing electrode pattern and the other sensing electrode pattern, but the embodiment is not limited thereto. That is, the one sensing electrode pattern and the other sensing electrode pattern may be formed at various positions.

The wire part 300 electrically connecting the sensing electrode 200 may be formed in the inactive area UA.

Figure 3:
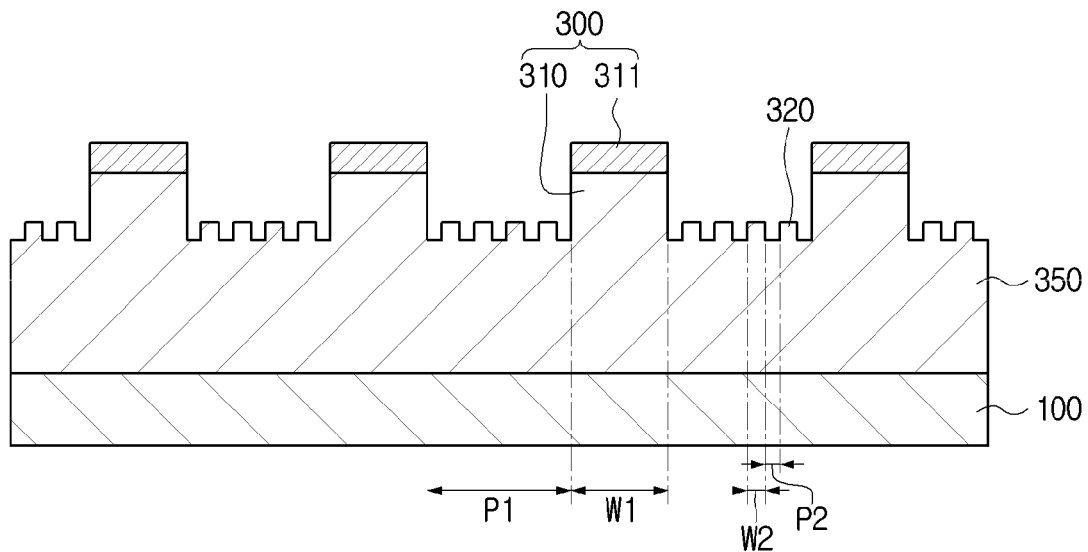
FIG. 3 is a sectional view taken along line B-B' of FIG. 2.

Referring to FIGS. 2 and 3, the wire part 300 includes first and second extending parts 301 and 302. The first and second extending parts 301 and 302 have mutually different directionalities. That is, the extending directions of the first and second extending parts 301 and 302 are different from each other.

The first extending part 301 may extend in a first direction. The first extending part 301 may have a linear shape.

The second extending part 302 is bent from the first extending part 301. The second extending part 302 may extend in a second direction crossing the first direction. The second extending part 302 may have a linear shape. That is, the first and second extending parts 301 and 302 may include linear lines, so that the wire part 300 does not include any curved lines. Therefore, the wire part 300 may have an 'L' shape.

An angle ($\theta$) between the first and second extending parts 301 and 302 may be a right angle. However, the angle ($\theta$) is not necessarily required to be a right angle and may be acceptable if the angle ($\theta$) is within a tolerance.

The wire parts may includes a dummy pattern 320. In this case, the dummy pattern 320 may be disposed between two adjacent first extending parts 301. In addition, the dummy pattern 320 may be disposed between two adjacent second extending parts 302. That is, the dummy patterns 320 may be disposed between the first extending parts 301 or the second extending parts 302.

The dummy pattern 320 may extend in one direction, For example, as shown in FIG. 2, the dummy pattern 320 may extend in a first direction.

Meanwhile, referring to FIG. 3, the wire part 300 includes a main pattern 310 and a conductive layer 311. That is, each of the first and second extending parts 301 and 302 includes the main pattern 310 and the first extending part 311.

The main pattern 310 is disposed on the substrate 100. The main pattern 310 may be convex. A line width W1 of the main pattern 310 may be in the range of 1 μm to 100 μm. Preferably, the line width W1 of the main pattern 310 may be in the range of 5 μm to 50 μm. More preferably, the line width W1 of the main pattern 310 may be in the range of 10 μm to 30 μm.

Further, a distance (pitch) P1 between the main patterns 310 may be in the range of 1 μm to 100 μm. Preferably, the distance (pitch) P1 between the main patterns 310 may be in the range of 5 μm to 50 μm. More preferably, the distance (pitch) P1 between the main patterns 310 may be in the range of 10 μm to 30 μm.

The pitch P1 may have a dimension equal to that of the line width W1. FIG. 3 shows the line width W1 of the main pattern 310 less than the pitch P1 for the purpose of convenience, but the line width W1 of the main pattern 310 may be equal to the pitch P1.

The dummy pattern 320 is disposed on the substrate 100. The dummy pattern 320 may be disposed among the main patterns 310. The dummy pattern 320 may be convex. A line width W2 of the dummy pattern 320 may be in the range of 50 nm to 300 nm. A distance (pitch) P2 among the dummy patterns 320 may be equal to or less than that W2 of the dummy pattern 320.

The main pattern 310 and the dummy pattern 320 may include resin or polymer. The main pattern 310 and the dummy pattern 320 may be disposed on a resin layer 350.

The conductive layer 311 is disposed on the main pattern 310. Since the conductive layer 311 is disposed on the main pattern 310, a line width of the conductive layer 311 may be equal or similar to that of the main pattern 310.

In the embodiment, the line width of the conductive layer 311 may be formed in a fine pattern to have a very narrow line width, so that an area of the inactive area UA, in which the wire part 300 is disposed may be reduced. Thus, a touch window having a narrow bezel may be implemented. Therefore, a screen size may be ensured and variety in design may be achieved without restriction by the bezel.

The conductive layer 311 may include a metal having superior electric conductivity. For example, the conductive layer 311 may include Cu, Au, Ag, Al, Ti, Ni or the alloy thereof.

An electrode pad (not shown) is placed at an end of the wire part 300. The electrode pad may be electrically connected to a printed circuit board. In detail, although not shown, a connector is placed on one surface of the printed circuit board, and the electrode pad may be electrically connected to the connector. The electrode pad may be formed in a size corresponding to that of the connector.

The printed circuit board may include various types of printed circuit boards. For example, the printed circuit board may include a flexible printed circuit board (FPCB).

Figure 4:
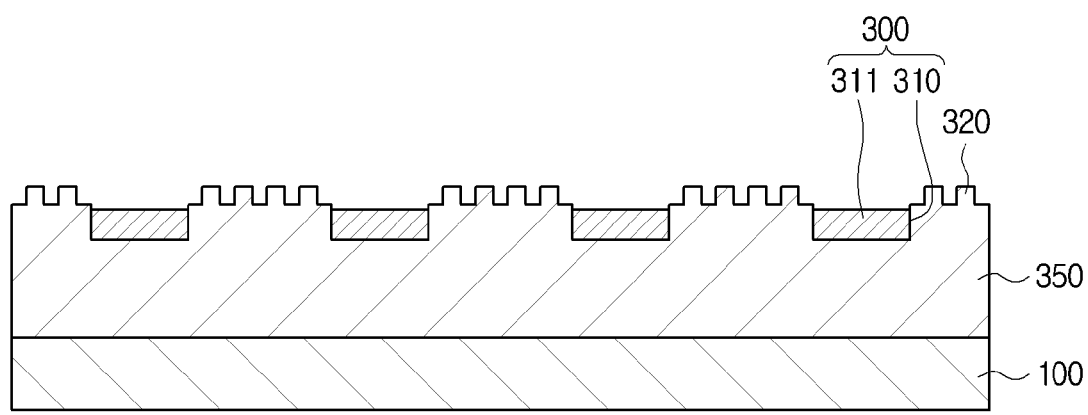
FIG. 4 is a sectional view showing a touch window according to another embodiment.

Hereinafter, a touch window according to another embodiment will be described with reference to FIG. 4. The details about the same or similar portions will be omitted for the purpose of brief description or clarity. FIG. 4 is a sectional view showing a touch window according to the second embodiment.

Referring to FIG. 4 a main pattern 310 has a concave shape. A conductive layer 311 may be disposed in the main pattern 310. Thus, the conductive layer 311 may be prevented from being delaminated from the main pattern 310.

Figure 5:
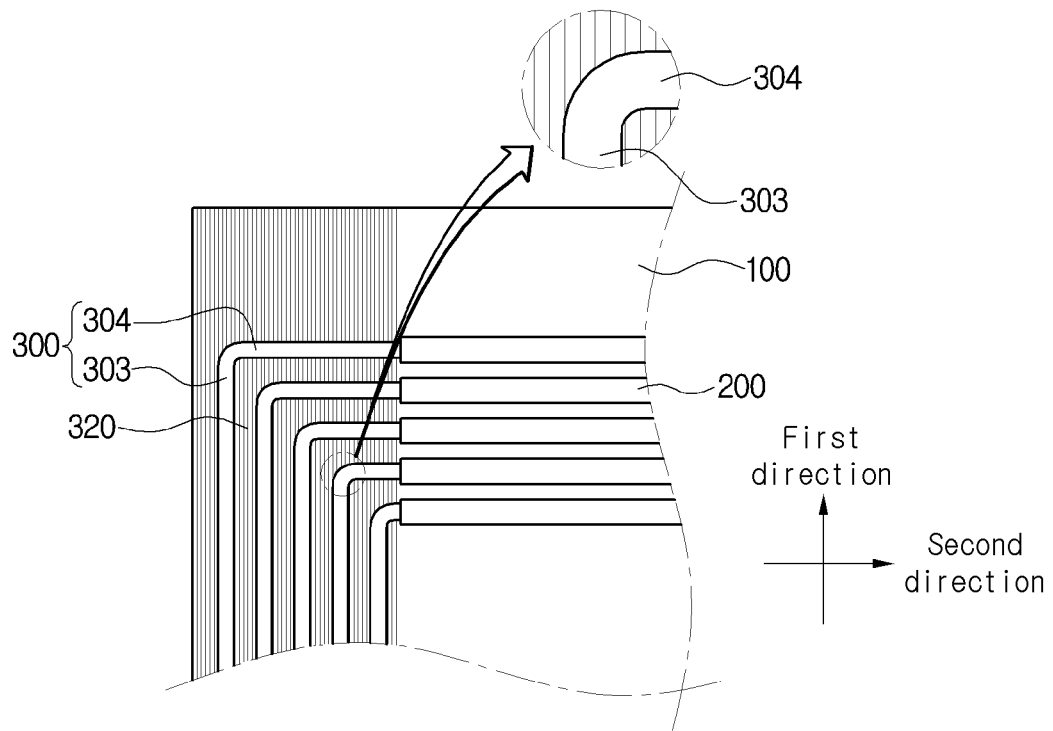
FIG. 5 is a plan view showing a touch window according to another embodiment.

Meanwhile, referring to FIG. 5, a wire part 300 includes first and second extending parts 303 and 304. The first and second extending parts 303 and 304 have mutually different directionalities. That is, the extending directions of the first and second extending parts 301 and 302 are different from each other.

A curve may be provided at a portion at which the first and second extending parts 303 and 304 meet each other. That is, differently from the structure of FIG. 2 described above, a line, which is not a linear line, may be provided between the first and second extending parts 303 and 304.

Hereinafter, a method of fabricating the touch window according to the embodiment will be described with reference to FIGS. 6 to 10. FIGS. 6 to 10 are sectional views illustrating the method of fabricating the touch window according to the embodiment.

First, although not shown in the drawings, the sensing electrode may be formed in the active area of the substrate in which the active and inactive areas are defined.

Figure 6:
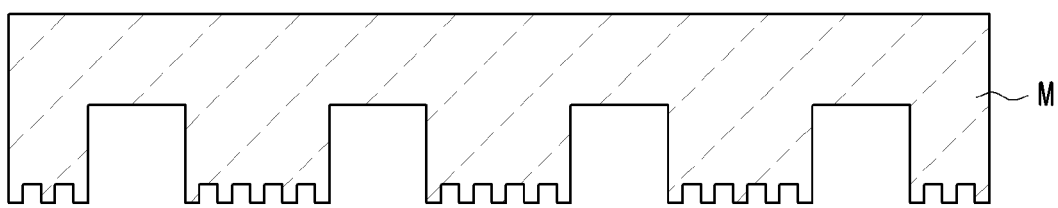
FIGS. 6 to 10 are views illustrating a method of fabricating a touch window according to an embodiment.
Figure 6:
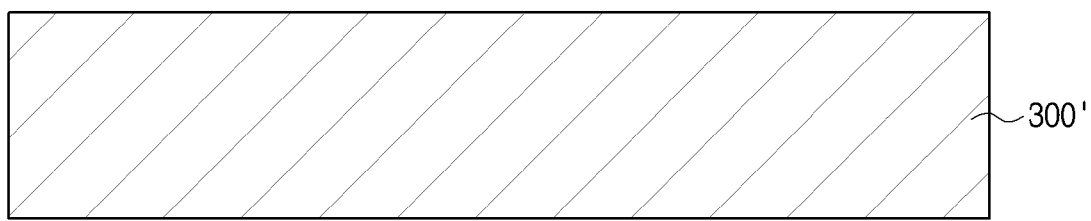
Figure 7:
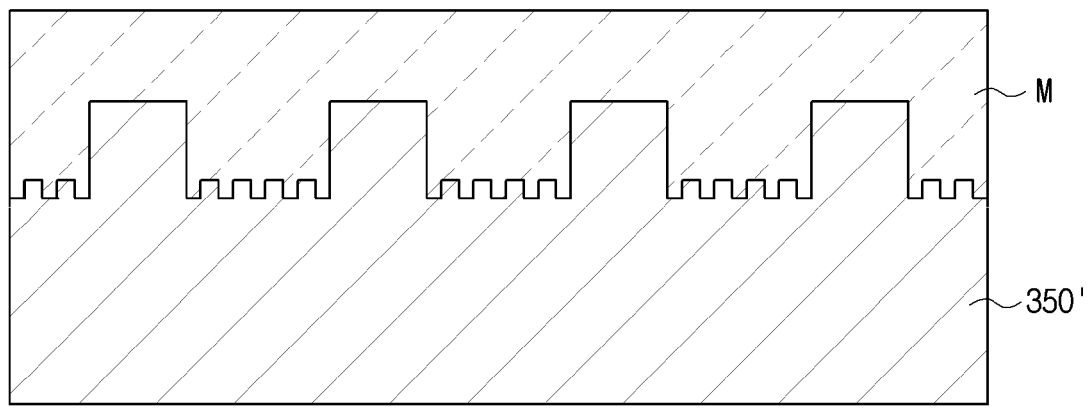

Then, referring to FIG. 6, a mold M having a pattern may be placed on a resin 300' which will be disposed on the inactive area. Then, referring to FIG. 7, when an imprinting process is performed by using the mold M on which a pattern is formed, a resin 350' on which a pattern is formed is formed.

Figure 8:
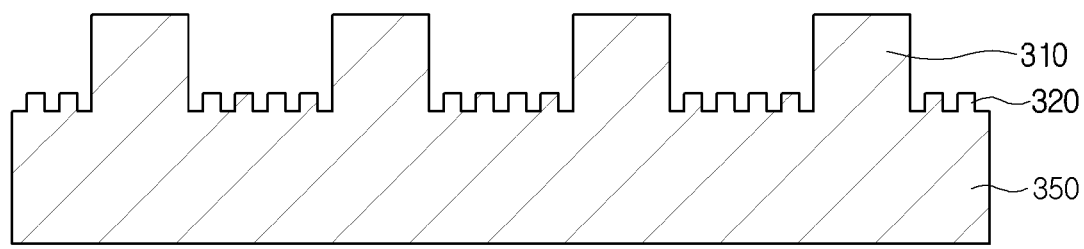

Referring to FIG. 8, the main pattern 310 and the dummy pattern 320 may be fabricated through the imprinting process.

Figure 9:
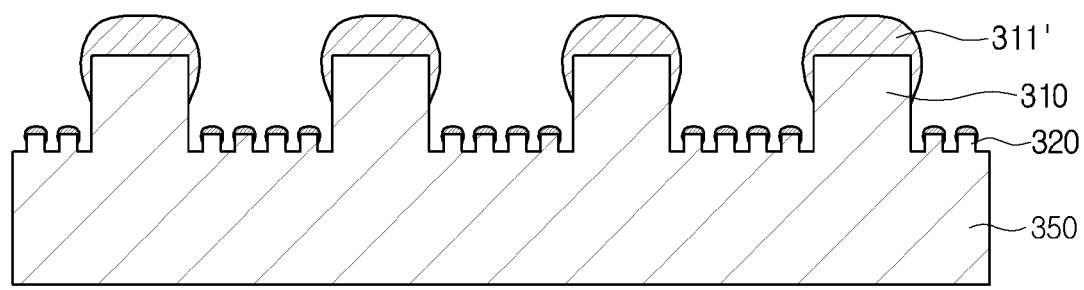

Referring to FIG. 9, a conductive material 311' may be formed on the main and dummy patterns 310 and 320. The conductive material 311' may be formed through a deposition scheme or a plating scheme.

Figure 10:
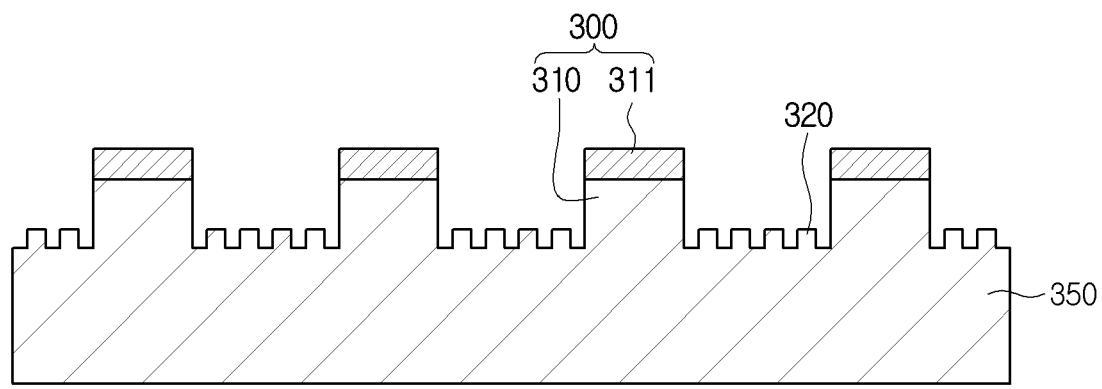

Referring to FIG. 10, the conductive materials 311' may be etched. In this case, a difference is made among etching areas depending on the difference among structures of the main and dummy patterns 310 and 320 and the difference among bonding areas with the electrode material 311'. In other words, since the bonding area between the main pattern 310 and the conductive material 311' is larger than the bonding area between the dummy pattern 320 and the conductive material 311', the conductive material 311' formed on the main pattern 310 may be less etched. In other words, as the etching process is performed at the same etching rate, the conductive material 311' formed on the main pattern 310 remains, and the conductive material 311' formed on the dummy pattern 320 is etched and removed. Therefore, the conductive layer 311 may be formed only on the main pattern 310.

Figure 11:
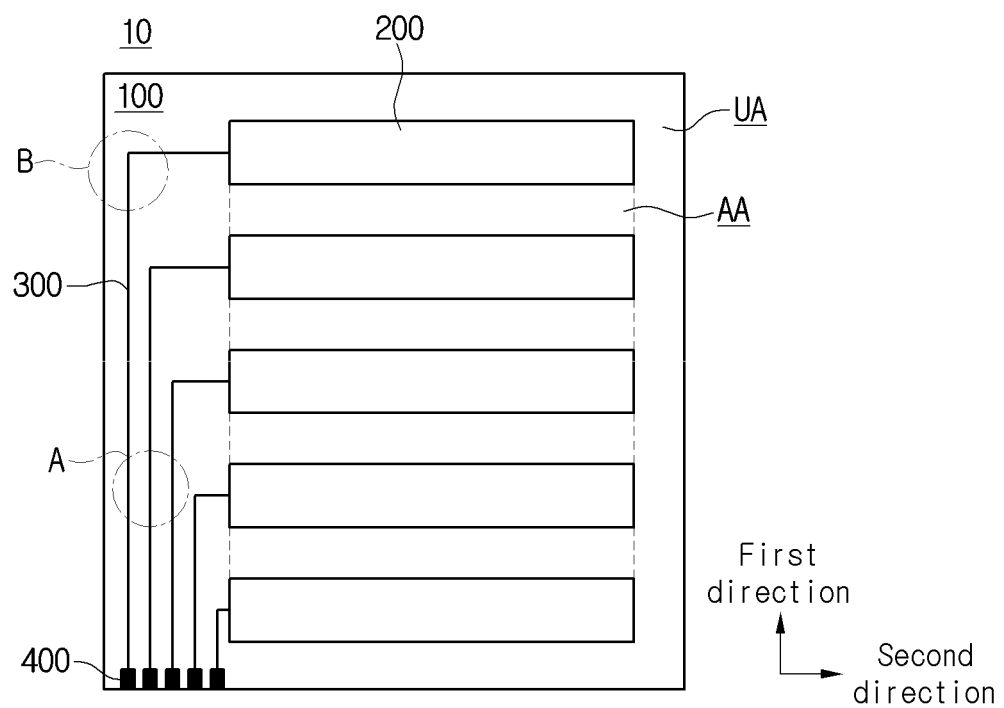
FIG. 11 is a plan view showing a touch window according to still another embodiment.
Figure 12:
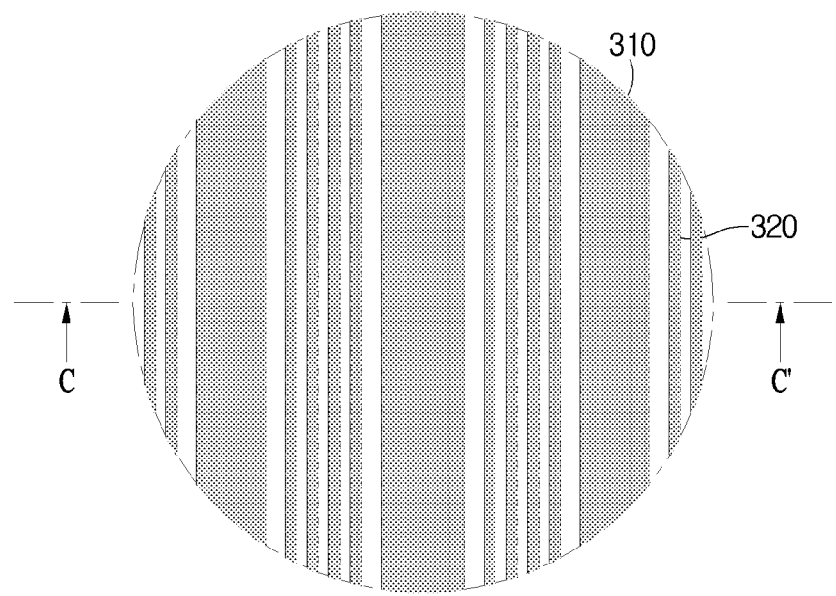
FIG. 12 is an enlarged view showing portion 'A' of FIG. 11.
Figure 13:
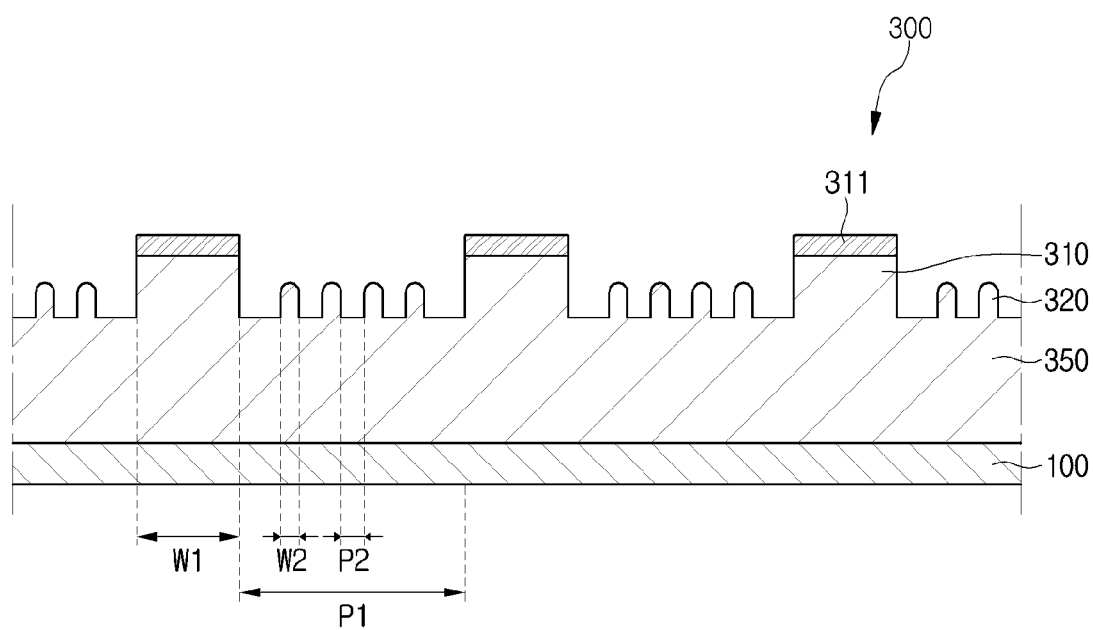
FIG. 13 is a sectional view taken along line C-C' of FIG. 12.

In addition, as shown in FIG. 2, the first and second extending parts 301 and 302 constituting the main pattern 310 may be perpendicular to each other, so that any residual conductive materials 311' that remain without being etched may not etched at any portions except for the main pattern 310. That is, any portions except form the main pattern 310 may be prevented from being non-etched. Thus, the wire part may be prevented from being short circuited to each other and the electric property may be improved. Meanwhile, referring to FIGS. 11 to 13, the wire part 300 for electrically connecting the sensing electrode 200 may be formed in the inactive area UA. Referring to FIGS. 12 and 13, the wire part 300 may include the main pattern 310, the dummy pattern 320 and the conductive layer 311.

The main pattern 310 is disposed on the substrate 100. The main pattern 310 may be convex. A line width W1 of the main pattern 310 may be in the range of 1 μm to 100 μm. Preferably, the line width W1 of the main pattern 310 may be in the range of 5 μm to 50 μm. More preferably, the line width W1 of the main pattern 310 may be in the range of 10 μm to 30 μm.

Further, a distance (pitch) P1 between the main patterns 310 may be in the range of 1 μm to 100 μm. Preferably, the distance (pitch) P1 between the main patterns 310 may be in the range of 5 μm to 50 μm. More preferably, the distance (pitch) P1 between the main patterns 310 may be in the range of 10 μm to 30 μm.

The pitch P1 may have a dimension equal to that of the line width W1. FIG. 13 shows the line width W1 of the main pattern 310 less than the pitch P1 for the purpose of convenience, but the line width W1 of the main pattern 310 may be equal to the pitch P1.

The dummy pattern 320 is disposed on the substrate 100. The dummy pattern 320 may be disposed among the main patterns 310. The dummy pattern 320 may be convex. A line width W2 of the dummy pattern 320 may be in the range of 50 nm to 300 nm. A distance (pitch) P2 among the dummy patterns 320 may be equal to or less than that W2 of the dummy pattern 320.

The main pattern 310 and the dummy pattern 320 may include resin or polymer.

The conductive layer 311 is disposed on the main pattern 310. Since the conductive layer 311 is disposed on the main pattern 310, a line width of the conductive layer 311 may be equal or similar to that of the main pattern 310.

In the embodiment, the line width of the conductive layer 311 may be formed in a fine pattern to have a very narrow line width, so that an area of the inactive area UA, in which the wire part 300 is disposed may be reduced. Thus, a touch window having a narrow bezel may be implemented. Therefore, a screen size may be ensured and variety in design may be achieved without restriction by the bezel.

The conductive layer 311 may include a metal having superior electric conductivity. For example, the conductive layer 311 may include Cu, Au, Ag, Al, Ti, Ni or the alloy thereof.

Figure 14:
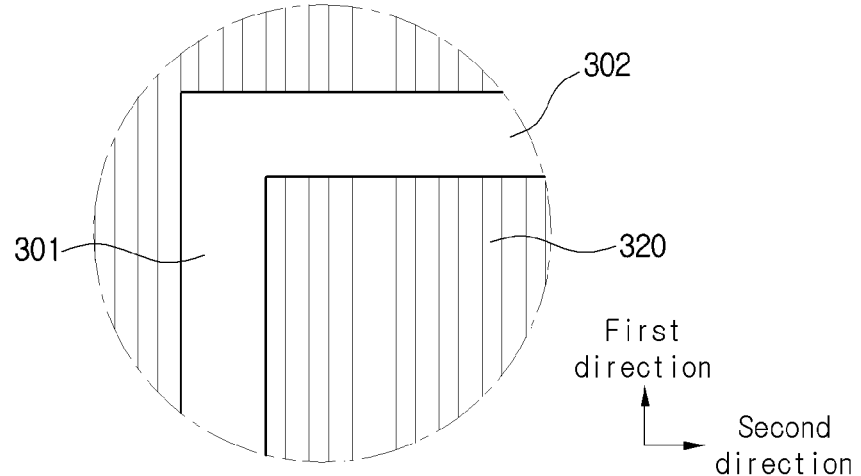
FIG. 14 is an enlarged view showing portion 'B' of FIG. 13.

Meanwhile, referring to FIG. 14, the main pattern 310 includes first and second extending parts 301 and 302. The first extending part 301 may extend in a first direction. The first extending part 301 may have a linear shape. The second extending part 302 is bent from the first extending part 301. The second extending part 302 may extend in a second direction crossing the first direction. The second extending part 302 may have a linear shape. The first and second extending parts 301 and 302 may be perpendicular to each other.

A dummy pattern 320 may be disposed adjacent to the first and second extending parts 301 and 302. For example, the dummy pattern 320 may be disposed between two adjacent first extending parts 301. In addition, the dummy pattern 320 may be disposed between two adjacent second extending parts 302. That is, the dummy patterns 320 may be disposed between the first extending parts 301 or the second extending parts 302.

The dummy pattern 320 may extend in one direction, For example, as shown in FIG. 14, the dummy pattern 320 may extend in a first direction.

An electrode pad 400 is placed at an end of the wire part 300. The electrode pad 400 may be electrically connected to a printed circuit board. In detail, although not shown, a connector is placed on one surface of the printed circuit board, and the electrode pad 400 may be electrically connected to the connector. The electrode pad 400 may be formed in a size corresponding to that of the connector.

The printed circuit board may include various types of printed circuit boards. For example, the printed circuit board may include a flexible printed circuit board (FPCB).

Hereinafter, a touch window according to another embodiment will be described with reference to FIG. 15. The details about the same or similar portions will be omitted for the purpose of brief explanation or clarity.

Figure 15:
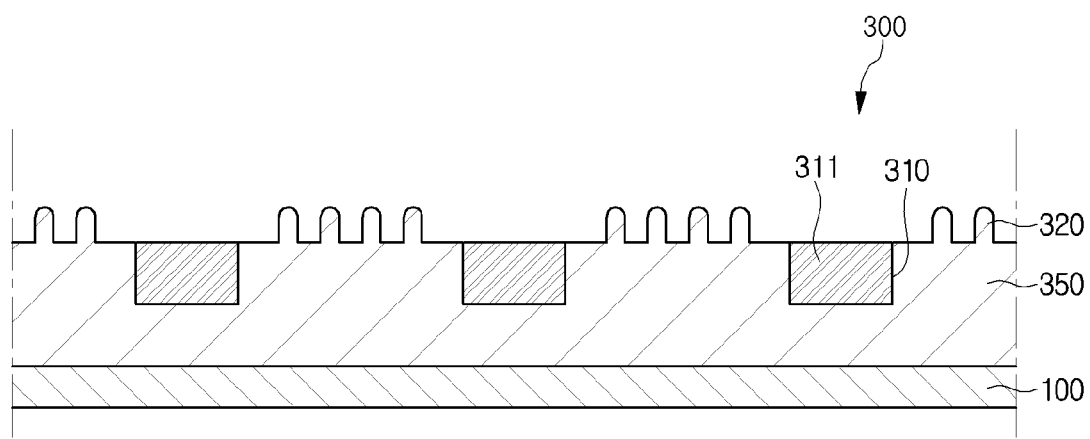
FIGS. 15 and 16 are sectional views showing a touch window according to still another embodiment.

Referring to FIG. 15 a main pattern 310 has a concave shape. A conductive layer 311 may be disposed in the main pattern 310. Thus, the conductive layer 311 may be prevented from being delaminated from the main pattern 310.

Hereinafter, a touch window according to another embodiment will be described with reference to FIGS. 16 to 20.

Figure 16:
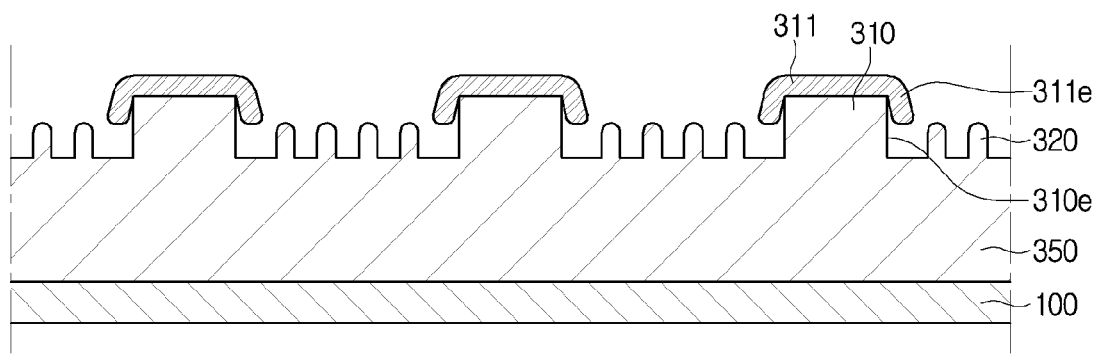

Referring to FIG. 16, an end 311e of the electrode layer 311 disposed on the main pattern 310 may be disposed on a portion of a side surface 310e of the main pattern 310. That is, the electrode layer 311 may be disposed as if it surrounds the main pattern 310. In this case, the end 311e of the electrode layer 311 may make direct-contact with or be spaced apart from the side surface 310e of the main pattern 310.

Figure 17:
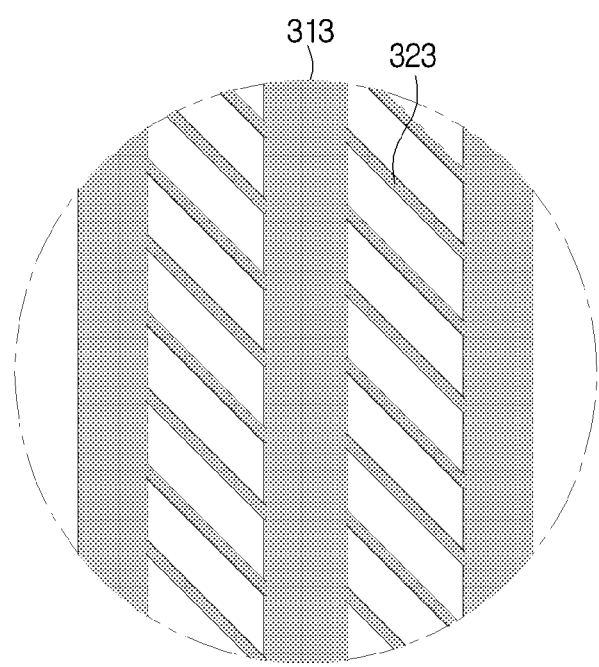
FIGS. 17 and 18 are enlarged views showing a touch window according to still another embodiment.

Meanwhile, referring to FIG. 17, the dummy pattern 323 may be disposed to cross the main pattern 313. That is, differently from the embodiment shown in FIG. 12, the main pattern 313 may not be parallel to the dummy pattern 323.

Figure 18:
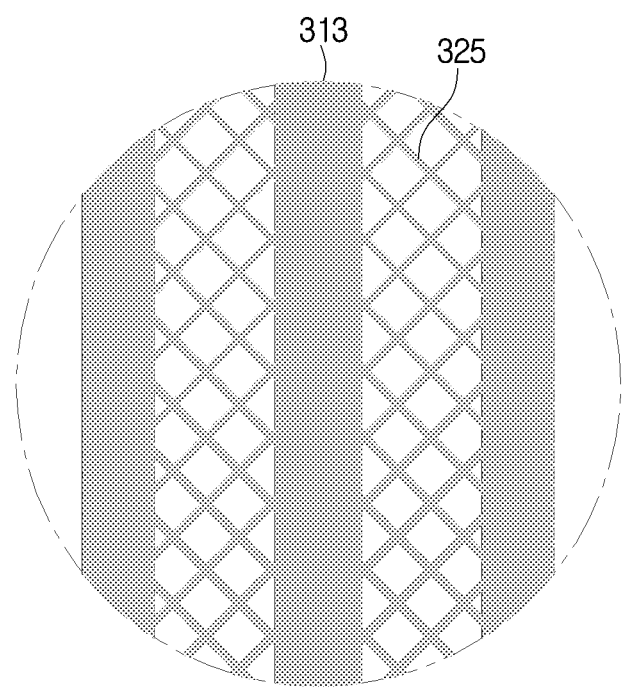

In addition, referring to FIG. 18, the dummy pattern 325 may be disposed to have a mesh shape.

Through the structures of FIGS. 17 and 18, when the electrode layer is formed, the conductive materials formed on the dummy patterns 323 and 325 may be easily etched. Thus, the conductive material may remain only on the main pattern 313.

Figure 19:
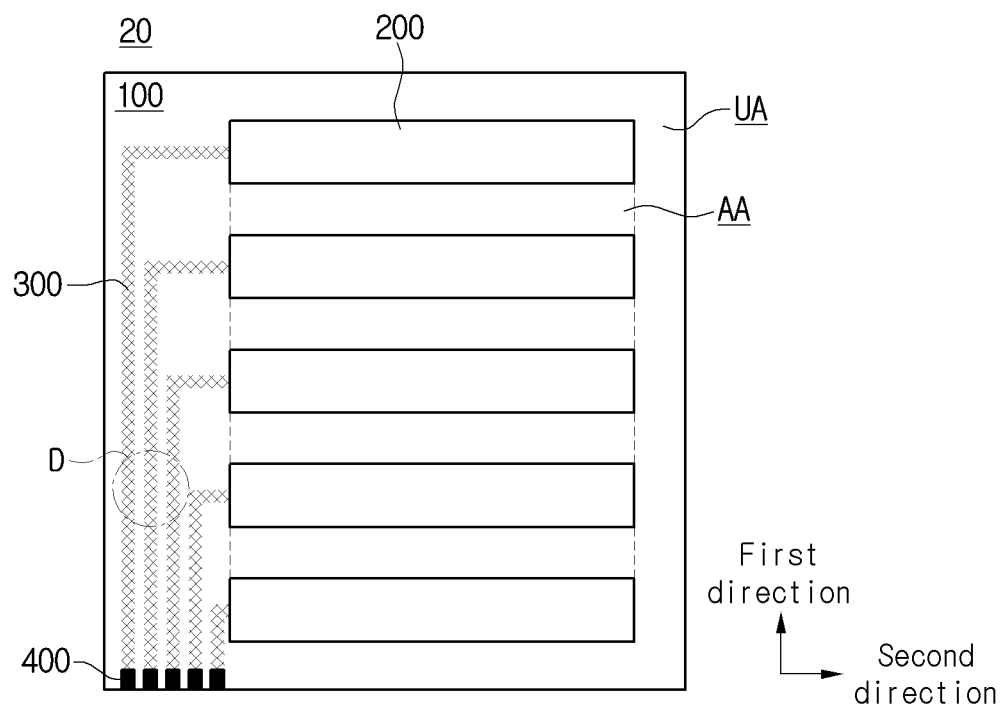
FIG. 19 is a plan view showing a touch window according to still another embodiment.
Figure 20:
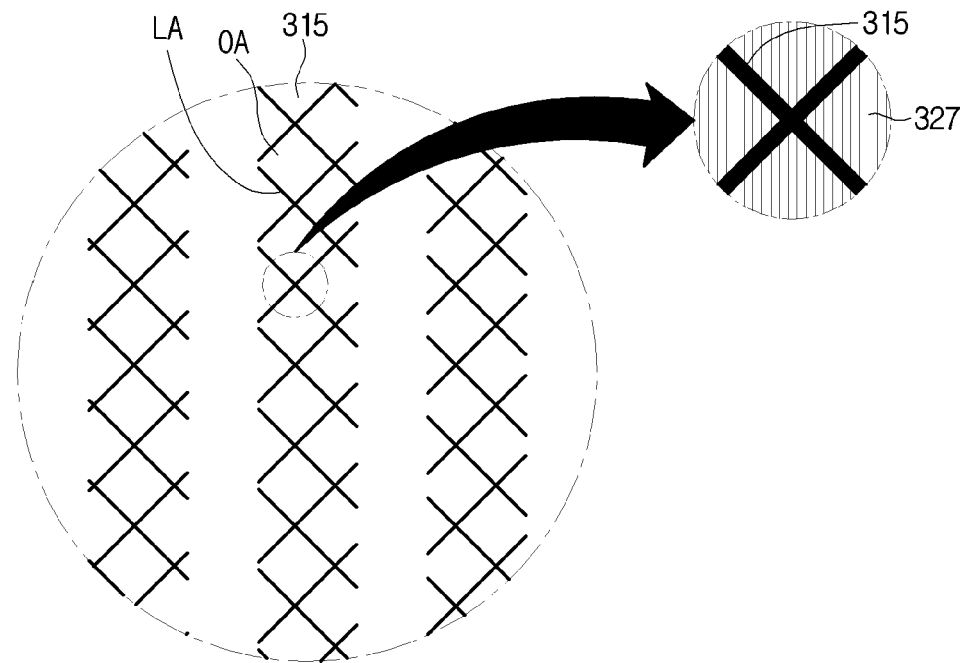
FIG. 20 is an enlarged view showing portion 'D' of FIG. 19.

Meanwhile, referring to FIGS. 19 and 20, in a touch window according to another embodiment, the main pattern 315 may include a conductive pattern. That is, the main pattern 315 may be disposed in a mesh shape.

In this case, the main pattern 315 may include a mesh opening OA and a mesh line LA. In this case, a line width of the mesh line LA may be in the range of 0.1 μm to 10 μm. The forming of a mesh line LA having a line width of 0.1 μm or less may be impossible in the fabricating process. If the line width is 10 μm or less, the pattern of the electrode layer may not be viewed. Preferably, the line width of the mesh line LA may be in the range of 1 μm to 7 μm. More preferably, the line width of the mesh line LA may be in the range of 2 μm to 5 μm.

As shown in FIG. 20, the mesh opening OA may have the shape of a rectangular shape, but the embodiment is not limited thereto. The mesh opening OA may have various shapes such as a polygonal shape including a diamond shape, a pentagonal shape or a hexagonal shape, or a circular shape and may be disposed regularly. That is, the conductive pattern may have a regular shape.

However, the embodiment is not limited to the above, and the conductive pattern may have an irregular shape. That is, conductive pattern openings may be variously provided in one conductive pattern.

The dummy pattern 327 is disposed adjacently to the main pattern 315. The dummy patterns 327 may be disposed among the main patterns 315. Thus, the dummy pattern 327 is disposed in the mesh opening OA.

Figure 21:
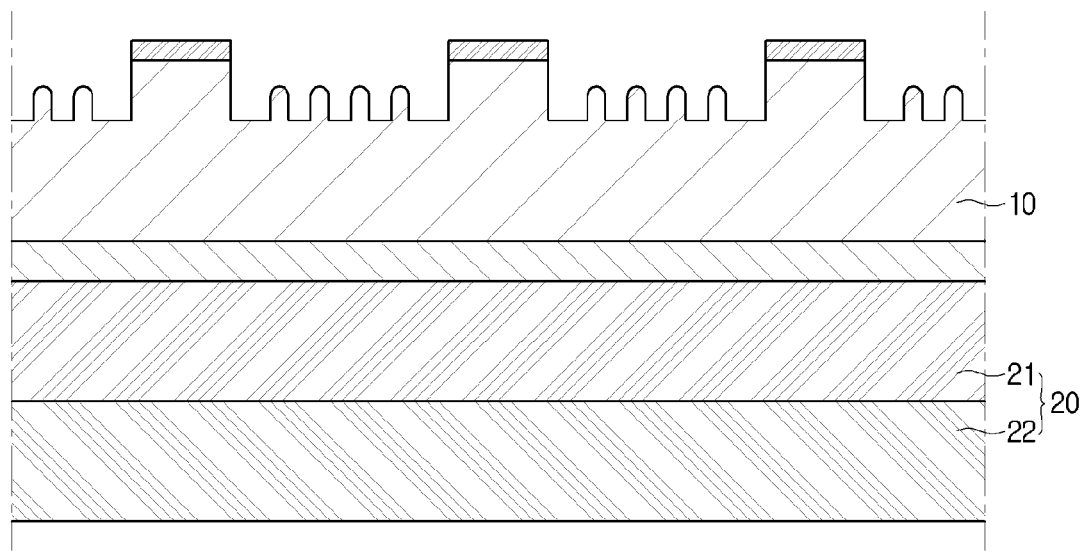
FIG. 21 is a sectional view showing a touch device in which a touch window is disposed on a display panel according to an embodiment.

Meanwhile, referring to FIG. 21, the touch window 10 may be disposed on a display panel 20 which is a driving unit. The touch window 10 is combined with the display panel 20 so that a touch device may be formed.

The display panel 20 is formed therein with a display region to display an image. Generally, the display panel applied to the display device may include an upper substrate 21 and a lower substrate 22. A data line, a gate line, and a thin film transistor TFT may be formed on the lower substrate 22. The upper substrate 21 may adhere to the lower substrate 22 to protect constituent elements disposed on the lower substrate 22.

The display panel 20 may be formed in various types according to a kind of the touch device. That is, the touch device according to the embodiment may include an LCD, a field emission display, a plasma display panel (PDP), an organic light emitting diode (OLED), and an electrophoretic display (EPD). Accordingly, the touch panel 20 may be configured in various types.

Meanwhile, the touch window may be applied to a vehicle as well as a touch device of a mobile terminal. For example, the touch window may be applied to a personal navigation display (PND) such as vehicle navigation. In addition, the touch window may be applied to a dashboard such that a center information display (CID) may be implemented. However, the embodiment is not limited to the above, and the touch device may be used for various electronic appliances.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A touch window comprising: a substrate comprising an active area and an inactive area;
   a sensing electrode disposed on the active area of the substrate to sense a position;
   a wire part to electrically connect the sensing electrodes and an electrode pad placed at an end of the wire part,
   wherein the wire part includes a plurality of wire parts disposed on the inactive area of the substrate,
   wherein the plurality of wire parts include first extending parts and second extending parts having mutually different directionalities,
   wherein the first and second extending parts include a main pattern and a conductive layer on the main pattern,
   wherein the wire part includes a plurality of dummy patterns,
   wherein the plurality of dummy patterns are disposed between two adjacent first extending parts,
   wherein the plurality of dummy patterns are disposed between two adjacent second extending parts, and
   wherein the dummy patterns are extended in a same direction as that of the first extending parts or the second extending parts,
   wherein an extended length of each dummy pattern is longer than an extended length of the first extending parts or the second extending parts,
   wherein the plurality of dummy patterns are disposed between two adjacent electrode pads, wherein a line width of the main pattern is in a range of 1 µm to 100 µm, wherein a distance between the main pattern and an adjacent main pattern is in a range of 1 µm to 100 µm,
   wherein a line width of each dummy pattern is in a range of 50 nm to 300 nm,
   wherein a line width of the conductive layer on the main pattern is greater than the line width of the dummy pattern, and
   wherein a distance between adjacent dummy patterns is equal to or less than the line width of each dummy pattern.

2. The touch window of claim 1, wherein the main pattern is disposed in a mesh shape.

3. The touch window of claim 1, wherein the dummy patterns extend in one direction.

4. The touch window of claim 1, wherein the main pattern and the dummy patterns include resin.

5. The touch window of claim 1, wherein the conductive layer includes Cu, Au, Ag, Al, Ti, Ni, or an alloy of any of them.

6. The touch window of claim 1, wherein the main pattern is convex or concave.

7. A touch window comprising:
   a substrate comprising an active area and an inactive area;
   a sensing electrode disposed on the active area of the substrate to sense a position; and
   a wire part to electrically connect the sensing electrodes and
   an electrode pad placed at an end of the wire part,
   wherein the wire part includes a plurality of wire parts disposed on the inactive area of the substrate,
   wherein the wire part includes a main pattern and a plurality of dummy patterns adjacent to the main pattern; and
   a conductive layer on the main pattern,
   wherein the plurality of dummy patterns are disposed among the main pattern, wherein an extended length of each dummy pattern is longer than an extended length of the conductive layer,
   wherein the plurality of dummy patterns are disposed between two adjacent electrode pads, wherein a line width of the main pattern is greater than a line width of each dummy pattern wherein a line width of the conductive layer on the main pattern is greater than the line width of each dummy pattern,
   wherein a distance between adjacent dummy patterns is equal to or less than the line width of each dummy pattern,
   wherein the line width of the main pattern is in a range of 1 µm to 100 µm, wherein a distance between the main pattern and an adjacent main pattern is in a range of 1 µm to 100 µm,
   wherein the line width of each dummy pattern is in a range of from 50 nm to 300 nm, wherein an end of the conductive layer is disposed on a portion of a side surface of the main pattern, and wherein the conductive layer surrounds an upper surface and the side surface of the main pattern.

8. The touch window of claim 7, wherein the main pattern is convex or concave.

9. The touch window of claim 7, wherein the main pattern includes a first extending part extending in a first direction; and a second extending part extending in a second direction.

10. The touch window of claim 7, wherein the dummy pattern extends in one direction.

11. The touch window of claim 7, wherein the conductive layer includes Cu, Au, Ag, Al, Ti, Ni, or an alloy of any of them.

12. The touch window of claim 7, wherein the main pattern includes a conductive pattern.

13. The touch window of claim 12, wherein a line width of the conductive pattern of the main pattern is in a range of 0.5 μm to 5 μm.

14. The touch window of claim 12, wherein a line width of the conductive pattern of the main pattern is greater than the line width of the dummy pattern.

15. The touch window of claim 7, wherein the main pattern crosses the dummy pattern.

16. A touch device comprising:
a touch window; and
a driving unit on the touch window,
wherein the touch window includes:
a substrate comprising an active area and an inactive area;
a sensing electrode disposed on the active area of the substrate to sense a position;
and a wire part to electrically connect the sensing electrodes; and
an electrode pad placed at an end of the wire part, wherein the wire part includes a plurality of wire parts disposed on the inactive area of the substrate, wherein the plurality of wire parts include first extending parts and second extending parts having mutually different directionalities, wherein the first and second extending parts include a main pattern and a conductive layer on the main pattern, wherein the wire part includes a plurality of dummy patterns, wherein the plurality of dummy patterns are disposed between two adjacent first extending parts, wherein the plurality of dummy patterns are disposed between two adjacent second extending parts, and wherein the dummy patterns are extended in a same direction as that of the first extending parts or the second extending parts, wherein an extended length of each dummy pattern is longer than an extended length of the first extending, parts or the second extending parts, wherein the plurality of dummy patterns are disposed between two adjacent electrode pads, wherein a line width of the main pattern is in a range of 1 μm to 100 μm, wherein a distance between the main pattern and an adjacent main pattern is in a range of 1 μm to 100 μm, wherein a line width of each dummy pattern is in a range of 50 nm to 300 nm, wherein a line width of the conductive layer of the main pattern is greater than the line width of each dummy pattern, and wherein a distance between adjacent dummy patterns is equal to or less than the line width of each dummy pattern.

17. The touch window of claim 7, wherein the dummy pattern is convex.

* * * * *